United States Patent [19]

Fushiki et al.

[11] Patent Number: 4,572,859
[45] Date of Patent: Feb. 25, 1986

[54] ELECTRICAL LAMINATE COMPRISING A PLURALITY OF FIBROUS LAYERS AND CURED RESIN LAYERS

[75] Inventors: Yasuo Fushiki, Takatsuki; Masaharu Abe; Masayuki Oizumi, both of Kobe, all of Japan

[73] Assignee: Kanegafuchi Kagaku Kogyo Kabushiki Kaisha, Osaka, Japan

[21] Appl. No.: 722,762

[22] Filed: Apr. 15, 1985

Related U.S. Application Data

[63] Continuation of Ser. No. 559,991, Dec. 9, 1983, abandoned, which is a continuation of Ser. No. 267,355, May 26, 1981, abandoned.

[30] Foreign Application Priority Data

| May 26, 1980 | [JP] | Japan | 55-70466 |
| May 26, 1980 | [JP] | Japan | 55-128935 |
| Sep. 16, 1980 | [JP] | Japan | 55-198936 |
| Sep. 16, 1980 | [JP] | Japan | 55-198937 |
| Sep. 16, 1980 | [JP] | Japan | 55-198938 |
| Sep. 22, 1980 | [JP] | Japan | 55-132157 |

[51] Int. Cl.⁴ .............................................. B32B 7/00
[52] U.S. Cl. .................................. 428/215; 428/414; 428/418; 428/481; 428/461; 428/531; 428/901; 428/514; 428/284; 428/290; 428/507
[58] Field of Search ................ 428/461, 507, 284, 290

[56] References Cited

U.S. PATENT DOCUMENTS

| 4,201,616 | 5/1980 | Chellis | 428/901 |
| 4,314,002 | 2/1982 | Oizumi et al. | 428/481 |
| 4,336,297 | 6/1982 | Fushiki et al. | 428/901 |

Primary Examiner—Patricia C. Ives
Attorney, Agent, or Firm—Armstrong, Nikaido, Marmelstein & Kubovcik

[57] ABSTRACT

An electrical laminate comprising a plurality of fibrous cellulosic substrate layers and alternately interposed layers of cured epoxy or unsaturated polyester resin between the adjacent substrate layers, wherein each of the substrate layers is embedded in a matrix of said cured resin which is substantially integral with said layers of cured resin, and consists essentially of cellulosic fibers having thereon a coating of methylol group-containing resin such as aminoplast resins. The laminate may be unclad or cladded with a metal foil.

13 Claims, 4 Drawing Figures

ELECTRICAL LAMINATE COMPRISING A PLURALITY OF FIBROUS LAYERS AND CURED RESIN LAYERS

This is a continuation of application Ser. No. 559,991 filed Dec. 9, 1983 now abandoned, which is a continuation of application Ser. No. 267,355 filed May 26, 1981, now abandoned.

This invention relates to electrical laminates such as electric insulating laminates or metal clad laminates for use in the production of printed circuit wiring boards.

Reinforced resin laminates find important uses as basic or supporting boards for mounting various electrical components or parts thereon. Metal clad, reinforced resin laminates find uses as electrical components such as printed circuit wiring boards. These laminates are conventionally prepared by impregnating a substrate with a solution of a thermosetting resin such as phenol resins or epoxy resins, drying and partially curing the impregnated substrate to form so-called "prepreg", stacking a plurality of prepregs, and curing the stacked prepregs under heat and pressure to form a unitary laminate. Metal clad laminates are prepared similarly except that a cladding metal foil is placed on the stacked prepregs prior to the curing step. Experiments have shown that these laminates thus prepared do not have a continuous resin layer interposed between adjacent individual substrate layers and fibers in one layer of the substrate are entangled and in direct contact with the fibers in an adjacent layer.

Experiments have also shown that the laminates, particularly when they are made from cellulosic substrates, tend to pick up water from the exterior resulting in the deterioration of various characteristics such as volume resistivity, surface resistivity, solder dip resistance, dimension stability and the like.

Conventional metal clad laminates have an additional layer of adhesive or resin of the same type as used in the impregnation of substrates beneath the metal foil. This layer will serve to a certain extent to seal the interior of laminate from moisture. It has been found, however, that this is not fully satisfactory for this purpose. Once an amount of water enters the interior of laminate, it will diffuse throughout the entire structure and may be retained therein.

In a co-pending application of Masayuki Oizumi et al, Ser. No. 116,599, filed Jan. 29, 1980, now U.S. Pat. No. 4,314,002, there is disclosed an electrical laminate having a plurality of cellulosic reinforced layers each fully impregnated with a thermoset resin, and unreinforced layers of a cured resin existing between and extending substantially over the surface of substrate layers. The laminate disclosed therein is characterized in that the layers of cured resin are substantially integral with the adjacent reinforcements which are, in turn, isolated from each other by said layers of cured resin. Thus, water guiding channels or network formed by cellulosic fibers in the reinforcements are disrupted by the presence of said layers of cured resin.

It is a main object of this invention to provide an electrical laminate, either unclad or clad, having improved properties.

It is another object of the present invention to provide an electrical laminate made of fibrous cellulosic substrate and an epoxy resin or an unsaturated polyester resin which can withstand moist conditions.

According to the present invention, there is provided an electrical laminate comprising a plurality of fibrous substrate layers and layers of a cured resin selected from the group consisting of an epoxy resin and an unsaturated polyester resin alternately disposed between and substantially extending over the surface of said substrate layers to form a unitary laminate. The improvement resides in said fibrous substrate layers wherein each of said substrate layers is embedded in a matrix of said cured resin which is integral with adjacent ones of said layers of cured resin, and consist essentially of cellulosic fibers having thereon a coating comprising a methylol group-containing resin. Preferably, the laminate has an additional layer of said cured resin on one or both sides thereof and a cladding metal foil may be positioned or bonded on said additional layer. The methylol group-containing resin is preferably an aminoplast resin and the coating preferably contains, in addition to this resin, an additive which facilitates the punching operation of the finished laminate.

The present invention may be fully understood by the following description in which reference is made to the accompanying drawing. In the drawing, FIG. 1 is an enlarged sectional view of an unclad electrical laminate constructed in accordance with the present invention.

Figure 1:
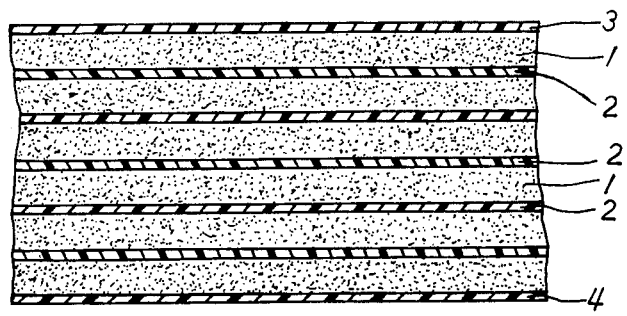
Figure 2:
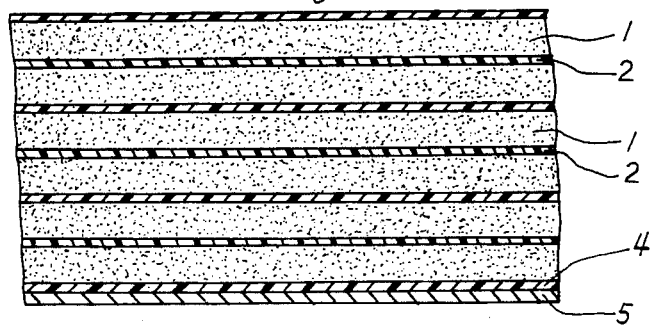
FIG. 2 is a view similar to FIG. 1 of a metal clad laminated constructed in accordance with the present invention.

In FIG. 1 and FIG. 2, an unclad or metal clad laminate is shown to have a plurality of fibrous substrate layers 1 each consisting essentially of cellulosic fibers such as papers made of wood pulp, cotton fibers, cotton linter pulp, regenerated cellulosic pulp, mixtures thereof and the like. Alternately disposed between the substrate layers are layers 2 of a cured resin selected form the group consisting of an epoxy resin and an unsaturated polyester resin. Also disposed on the outer surface of an outermost substrate layer 1 is an additional layer 3 of cured resin which may exists on the opposite side of laminate as shown at 4. A cladding metal foil 5 may be positioned on the additional layer of cured resin 4 as shown in FIG. 2, and also on the additional layer 3 if a two-side clad laminate is desired.

The cellulosic fibers forming individual substrate layers 1 are embedded in their own layers in a matrix of cured resin also selected from the group consisting of an epoxy resin and an unsaturated polyester resin. The material of layers 2, 3 and 4 may be the same as that of matrix of resin into which cellulosic fibers are embedded. Thus, each of the substrate layers 1 is spaced apart from the adjacent ones and the water guiding channels or network across the laminate may be prevented from forming via hydrophilic cellulose fibers by the presence of an interposing resin layer 2 between the adjacent substrate layers. The additional resin layers 3 and 4 effectively prevent the cellulose fibers present in the outermost layers of substrate from exposing to the exterior. The resin matrix formed in each of substrate layer 1 is substantially integral with the adjacent resin layers 2, 3 or 4.

Figure 3:
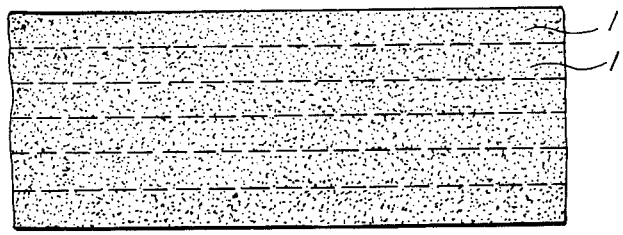
FIG. 3 is a view similar to FIG. 1 of an unclad laminate of conventional construction.
Figure 4:
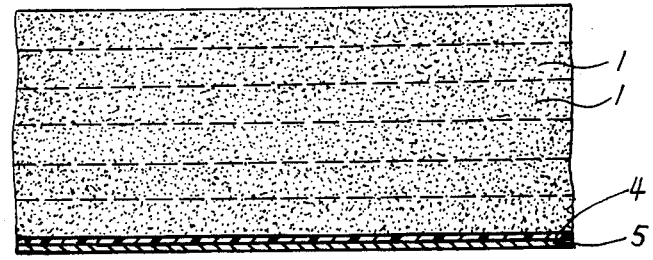
FIG. 4 is a view similar to FIG. 1 of a prior art metal clad laminate.

It will be easily understood that the above construction may greatly decrease the moisture pick-up of the resultant laminate and effectively prevent the decrease in properties thereof under wet conditions, compared with the construction of typical prior art laminates shown in FIG. 3 and FIG. 4. These prior art laminates do not have any discrete layer of cured resin which spaces the adjacent substrate layers 1 apart, nor do they have an outermost resin layer similar to the layer 3 of this invention. Although a metal clad laminate is shown to have a discrete resin layer 4 beneath a cladding metal foil 5 in FIG. 4, this resin layer is not fully protective against the environment because it serves only temporally as a barrier against water.

The electrical laminate of the present invention is also characterized in that the cellulosic fibers embedded in a matrix of cured resin in individual substrate layers are pretreated with a methylol group-containing resin such as aminoplast resins, phenol resins and the like. Aminoplast resins such as urea resins, cyclic urea resins, melamine resins, and guanamine resins are preferable. Mixtures or co-condensation products of two or more aminoplast resins or phenol-modified aminoplast resins may also be used. Melamine and guanamine resins are most preferable.

These methylol group-containing resins are preferably modified with an additive which facilitates the punching operation of finished laminates. The additive falls in one of the following classes:

(a) Higher fatty derivatives having a functional group capable of condensing with a methylol group:

The additives in this class have a higher fatty chain and a functional group capable of condensing with a methylol group. Examples of said functional groups include carboxylic, hydroxy, amino and amino groups. Preferably the higher fatty chain consists of $C_8$ to $C_{22}$ inclusive of carbonyl carbon atom.

Specific examples of such higher fatty derivatives include saturated higher fatty acids such as caprylic acid, capric acid, lauric acid, myristic acid, palmitic acid and stearic acid; unsaturated higher fatty acids such as oleic acid, erucic acid, linoleic acid, eleostearic acid and linolenic acid; partial esters of these saturated or unsaturated fatty acids with polyols such as ethyleneglycol, polyethyleneglycol, propyleneglycol, polypropyleneglycol, glycerine, pentaerythritol, sorbitol and sucrose; amides of said higher fatty acids; saturated and unsaturated higher fatty alcohols such as capryl alcohol, lauryl alcohol, myristyl alcohol, stearyl alcohol, cetyl alcohol, oleyl alcohol and linoleyl alcohol; partial ethers of these higher fatty alcohols with the aforementioned polyols; and amines derived from the aforementioned higher fatty alcohols. Hydroxy fatty acids such as ricinoleic acid and their derivatives of the aforementioned classes may also be used. Oleic acid, oleyl alcohol, oleylamine, oleic amide, glyceryl monooleate and glyceryl dioleate have been found preferable.

(b) Compounds having an unsaturated bond capable of copolymerizing with a vinyl monomer and a functional group capable of condensing with a methylol group:

Examples of compounds in this class include unsaturated carboxylic acids such as acrylic acid, methacrylic acid and itaconic acid; unsaturated carboxamides such as acrylamide and methacrylamide; hydroxy group-containing unsaturated compounds such as hydroxyethyl methacrylate, polyethylene glycol monomethacrylate and polypropylene glycol monomethacrylate; N-methylacrylamide and glycidyl methacrylate.

The compounds in this class may improve the adhesion of substrate to the resin matrix into which the substrate is embedded when an unsaturated polyester resin is used.

(c) Flexible epoxy resins:

Examples of additives in this class include diglycidyl ether of dimer acid, diglycidyl ether of bisphenol A alkyleneoxide adduct, diglycidyl ether of polyalkylene glycol, glycerine diglycidyl ether, neopentyl glycol diglycidyl ether, 1,6-hexanediol diglycidyl ether, aliphatic alcohol monoglycidyl ethers, epoxydized oils such as epoxydized soyabean oil and epoxydized fatty acid monoesters.

(d) Fatty acid esters of epoxy resins:

They may be produced by reacting an epoxy resin with a fatty acid at a higher temperature, for example, at 140°–240° C. Preferable examples of epoxy resins are bisphenol A diglycidyl ethers having an epoxy equivalent of about 150–2500 and a molecular weight of about 300–2900.

Examples of fatty acids include drying oil fatty acids such as linseed oil fatty acid, dehydrated castor oil fatty acid and soyabean oil fatty acid; non-drying oil fatty acids such as coconut oil fatty acid, and semi-drying oil fatty acids.

(e) Flexible thermoplastic resins:

(i) Acrylic polymers and copolymers:

Examples included are polymers of $C_1$–$C_{14}$ alkyl acrylates such as methyl acrylate, ethyl acrylate, butyl acrylate, isobutyl acrylate, 2-ethylhexyl acrylate, polymers of $C_6$–$C_{16}$ alkyl methacrylates; and copolymers of said acrylates or methacrylates with other comonomers such as methyl methacrylate, ethyl acrylate, acrylonitrile, acrylic acid, methacrylic acid, acrylamide, methacrylamide, dimethylaminoethyl methacrylate, N-methylolacrylamide, N-butoxymethylacrylamide, hydroxyethyl acrylate, hydroxyethyl methacrylate, hydroxypropyl methacrylate, glycidyl methacrylate, styrene, vinyl acetate, vinyl chloride, dibutyl maleate, maleic anhydride, itaconic acid and the like.

(ii) Flexible polymers and copolymers of conjugated diene compounds:

Examples included are homopolymers of conjugated diene monomers such as butadiene, isoprene and chloroprene; and copolymers of said diene monomers with acrylic or vinyl monomers mentioned in (i), e.g. butadiene-styrene, butadiene-acrylonitrile or butadiene-methyl methacrylate copolymers.

(iii) Flexible olefinic polymers and copolymers:

Examples included are polyethylene, polyisobutylene, ethylene-vinyl acetate copolymer, saponified ethylene-vinyl acetate copolymer and copolymers of ethylene with comonomers mentioned in (i) above.

(iv) Polyvinyl acetate; copolymers of vinyl acetate with comonomers mentioned in (i) above and saponified products thereof; polyvinyl alcohol; and polyvinyl acetal.

The term "copolymer" used herein means to include random, block and graft copolymers of binary or more comonomers polymerized by conventional methods such as emulsion, solution, suspension and block polymerization methods.

(v) Flexible alkyd resins:

These resins may be prepared by reacting a polybasic carboxylic acid with a polyhydric alcohol. Examples of polybasic carboxylic acids are phthalic anhydride, isophthalic acid, terephthalic acid, adipic acid, sebacic acid, azelaic acid, succinic acid and dimer acid.

Examples of polyhydric alcohols include ethylene glycol, diethylene glycol, 1,4-butanediol, 1,5-pentanediol, glycerine, trimethylolpropane and pentaerythritol.

The alkyd resins may be modified with oils or rosin acid.

(vi) Flexible polyamide resins:

These resins may be prepared by reacting a polybasic acid named in (v) above with a diamine such as ethylenediamine, triethylenediamine, hexamethylenediamine and the like.

The thermoplastic resins (i) through (vi) above preferably have a softening point below 30° C., more preferably below 0° C.

Experiments have shown that thermoplastic resins having at least one functional group such as carboxyl, hydroxy, amino, amido, methylol or epoxy are preferable as the decrease in heat resistance and mechanical strength of finished laminates is minimum. For this reason alkyd resins having free carboxyl or hydroxy groups at terminals and polyamide resins having free carboxyl or amino groups at terminals are preferable.

These functional groups may be introduced into acrylic polymers (i), conjugated dienic polymers (ii), olefinic polymers (iii) and vinyl acetate polymers (iv) above by copolymerizing with appropriate comonomers having such functional groups. Examples of these comonomers include carboxyl group-containing monomers such as acrylic acid, methacrylic acid, maleic anhydride and itaconic acid; amino or amido group-containing monomers such as dimethylaminoethyl methacrylate, acrylamide and methacrylamide; hydroxy group-containing monomers such as 2-hydroxyethyl acrylate, 2-hydroxyethyl methacrylate and 2-hydroxypropyl methacrylate; N-methylol acrylamide; and glycidyl methacrylate. Experiments have shown that the use acrylic copolymers or dienic copolymers having these functional comonomers in combination with an aminoplast resin gives well-balanced properties in dielectric and heat resistance characteristics and mechanical strength under both normal and wet conditions to the resultant laminates while improving punchability thereof.

(f) Aromatic sulfonamides, aromatic carboxamides and aromatic amines:

Examples of these compounds include p-toluenesulfonamide, o-toluenesulfonamide, benzenesulfonamide, naphthalenesulfonamide, benzamide, o-, m- or p-toluamide, aniline, toluidine, xylidine, benzylamine, diphenylamine and mixtures thereof. p- or o-Toluenesulfonamide and a mixture thereof are preferable.

Optimum ratio of the above additive to the methylol resin depends upon the nature of particular substrate material and matrix resin. Generally from 3 to 40 parts by weight of the additive per 100 parts of the methylol group-containing resin give satisfactory results. For pretreating cellulosic fibrous substrates, the methylol group-containing resin and the additive are dissolved or dispersed in a solvent such as water, alcohols, ketones or esters. Then the substrates are impregnated or otherwise applied with the solution or dispersion, and dried to give a coating on the surface of cellulosic fibers in the substrate.

The amount of coating in terms of pick-ups on dry basis is preferably from 5 to 30%, more preferably 10 to 20% by weight based on the dry weight of substrate. Excessive pick-ups may adversely affect impregnation of substrates with curable resins in a subsequent step.

The pretreatment of cellulosic fibrous substrate in accordance with the present invention may improve the volume and surface resistivities and flexural strength of finished laminates and also effectively prevent whitening phenomena of laminates caused by punching impact. It is postulated that these advantageous effects are derived from a higher affinity of methylol group-containing resin to cellulosic fibers and to epoxy or unsaturated polyester resins.

Any conventional epoxy resin or unsaturated polyester resin may be used for the fabrication of the electrical laminate of this invention. A suitable class or resins are selected depending upon the intended use of finished unclad and metal clad laminates. The resins are preferably liquid at room temperature prior to curing, and free of any volatile solvent. The cellulosic substrate pretreated as previously described may be impregnated with the resin in this form. The use of resin solution often causes the coating on cellulose fibers to be removed.

The electrical laminate of the present invention may be fabricated by any conventional technique. Suitable method and conditions depend upon the nature of particular resin employed. For instance, a prepreg may be prepared in well-known manner. Liquid resins of the mentioned type is then uniformly applied on the surface of prepreg, and a plurality of prepregs are stacked. The stacked prepregs are then cured in a press under heat and pressure. A cladding metal foil such as electrolytic copper foil may be placed on the stacked prepregs before curing. Caution must be taken to avoid excessive pressure which would squeeze out the liquid resin from the spaces between individual prepregs. It is for this reason that epoxy resins or unsaturated polyester resins are preferable for the present invention. These resins may be cured without applying pressure and a small amount of pressure, if needed, may be applied for the purpose of controlling the thickness of cured resin layers which spaces individual substrate layers.

In a preferred embodiment, a cellulosic fibrous substrate which has been previously given a coating as described is impregnated with an excessive amount of liquid resin and a plurality of resin-impregnated substrates are stacked. If the amount of liquid resin is deficient, additional amounts of liquid resin may be applied on the surface of substrate prior to stacking. The stacked substrates are then passed through a slit having a suitable clearance which determines the total thickness of finished laminate. The clearance of slit may be suitably adjustable depending upon the thickness and number of plies of individual substrates and the desired thickness of individual interposing resin layers. The stacked uncured structure may be sandwiched between a pair of metal foils, cellophane sheets, plastic sheets and the like in order to protect liquid resin components including catalysts, curing agents and the like from atmospheric oxygen. These covering sheets may be stripped after curing or become an integral part of the finished laminate to give a metal clad laminate.

The entire structure thus prepared is then cured under heat substantially without applying pressure. The above process may be carried out either batchwise or in a continuous manner. Using this process, the electrical laminate of this invention may be desirably fabricated without any difficulty. The viscosity of liquid resin is an important factor for achieving the desired impregnation of substrates and the desired thickness of cured resin layers. For this reason, liquid unsaturated polyester resins which may have a viscosity range from 0.05 to 30 poise are preferable.

Each of the interposing resin layers preferably has a thickness less than that of individual substrate and ranges from 1 to 100 μm. Excessively thick resin layers may adversely affect the characteristics of finished laminate, particularly punching characteristics. Excellent punching characteristics may be obtained when the individual resin layers have a thickness of 1 to 30 μm, preferably 5 to 25 μm. The laminates having these parameters may be easily punched with arrays or patterns of number of holes with small pitches without generating cracks or peeling. The punching operation may be carried out at room temperature or higher, e.g. at a temperature of 50°-60° C. The punching operation may be facilitated by the use of a cured resin having a glass transition temperature of 20°-80° C., preferably 40°-70° C., and also by the use of additives as previously mentioned in combination.

The materials of interposing resin layers and of resin matrix may be different or same, while the use of same material may give improved heat resistance such as solder dip resistance, and also improved anti-peeling characteristics upon mechanical shocks and punching operations.

The resin layers existing between the adjacent substrate layers may contain discrete fibrous fillers such as glass fibers, asbestos and cellulose fibers, or flat fillers such as mica and talc in order to improve mechanical properties such as flexural strength, flexural modulus, hot flexural strength, hot flexural modulus, flexural creep characteristic and the like. The amount of these fillers in the total mixture should not exceed 50% by weight and preferably ranges from 3 to 30% by weight. It is important for these fillers to be present in the resin layer substantially as discrete particles. Cellulose fibers are preferable as the wear of punching die is minimum.

The presence of interposed resin layers, for example, layer 2 in FIG. 1 and their thickness may be examined by viewing a section of laminates of this invention with a 10-100 fold microscope. A clean section may be exposed by shaving an edge of sample piece, or by fixing the sample piece with a potting resin followed by cutting and polishing the section.

For producing metal clad laminates, a metal foil having a higher electro-conductivity and a higher mechanical strength such as aluminum foils and copper foils, particularly electrolytic copper foils are preferable. These foils are bonded to the outermost substrate via a resin layer, for example, layer 4 in FIG. 2. This resin layer preferably consists of a fully cured epoxy adhesive. Suitable examples thereof include bisphenol A type epoxy resins combined with polyamide curing agents. Adhesives of this type do not require high pressure upon curing and hence avoiding the spillage of liquid resin from spaces between adjacent substrate layers. According to the above-described process, an unclad laminate of 0.5-3 mm thick or a metal clad laminate having an unclad portion of the same size may be prepared by alternately laminating two to ten sheets of substrates prepared from a paper of 200-300 μm thick on a corresponding number of interposing cured resin layers.

To further illustrate the invention, the following non-limiting examples are presented. Unless otherwise indicated all parts and percents are by weight.

EXAMPLE 1

12 parts of a commercially available melamine resin (NIKARESIN S-305, Nippon Carbite Industry Co., Ltd.) 1.6 parts of glyceryl monooleate and 0.2 parts of a nonionic surfactant (EMULGEN 935, Kao Soap Co., Ltd.) were dissolved in 100 parts of water.

A kraft paper having a basis weight of 150 g/m$^2$ (MKP-150, Tomoegawa Paper Co., Ltd.) was soaked in the above solution, squeezed to a pick-up of 100%, and then dried at 100° C. for 10 minutes.

The resulting substrate was impregnated with a commercial liquid unsaturated polyester resin (POLYMAL 6305, Takeda Chemical Industries, Ltd.) containing 1% of a curing catalyst (PERBUTYL O, Nippon Oil And Fats Co., Ltd.). Five plies of impregnated substrates were stacked. The combined stack was then cured without pressure to obtain an unclad laminate similar to the laminate of FIG. 1, having a total thickness of about 1.5 mm. This laminate showed to have a continuous cured resin layer of about 15 μm thick between individual substrate layers and also on both sides. Properties of the finished laminate are shown in Table 1.

EXAMPLE 2

Example 1 was repeated except that the paper substrated was treated with a solution of 12 parts of a commercial melamine resin (NIKARESIN S-305) and 2 parts of polypropylene glycol monomethacrylate (BRENMER PP-1000, Nippon Oil And Fats Co., Ltd.) in 70 parts of methanol and 30 parts of water. Properties of the resultant laminate of about 1.5 mm thick are shown in Table 1.

EXAMPLE 3

Example 1 was repeated except that the paper substrate was treated with a solution of 12 parts of a commercial melamine resin (NIKARESIN S-305) and 2 parts of polypropylene glycol diglycidyl ether (DER 736, Dow Chemical) in 70 parts of methanol and 30 parts of water.

Properties of the resultant laminate of about 1.5 mm thick are shown in Table 1.

CONTROL EXAMPLE 1

Using the melamine resin-treated paper and unsaturated polyester resin prepared in Example 1, a laminate of about 1.4 mm thick similar to the laminate of FIG. 3 was prepared. This laminate did not have a resin layer between individual substrate layers and on both sides. Properties of this laminate are shown in Table 1.

CONTROL EXAMPLE 2

Example 1 was repeated except that the paper substrated was not treated with a melamine resin solution.

Properties of the resulting laminate are shown in Table 1.

CONTROL EXAMPLE 3

A commercially available phenol resin-paper laminate of XPC grade was tested as a control. Properties of this laminate are shown in Table 1. As shown in Table 1, this commercial laminate may be ranked in a higher class among commercial products. Table 1 shows that the products of this invention, however, are superior to this commercial product and also to other control samples.

TABLE 1

| Test item | Conditions | Unit | Ex. 1 | Ex. 2 | Ex. 3 | Con. 1 | Con. 2 | Con. 3 |
|---|---|---|---|---|---|---|---|---|
| Volume resist. | C-96/23/55 | Ohm-cm | $3.5 \times 10^{15}$ | $29. \times 10^{15}$ | $4.1 \times 10^{15}$ | $3.3 \times 10^{13}$ | $1.5 \times 10^{14}$ | $1.2 \times 10^{13}$ |
|  | C-96/40/95 |  | $8.7 \times 10^{14}$ | $6.3 \times 10^{14}$ | $9.5 \times 10^{14}$ | $4.1 \times 10^{12}$ | $8.0 \times 10^{12}$ | $6.5 \times 10^{12}$ |
| Surface resist. | C-96/23/55 | Ohm | $2.3 \times 10^{15}$ | $2.2 \times 10^{15}$ | $2.9 \times 10^{15}$ | $5.0 \times 10^{12}$ | $6.1 \times 10^{12}$ | $3.2 \times 10^{12}$ |
|  | C-96/40/95 |  | $2.6 \times 10^{14}$ | $2.7 \times 10^{14}$ | $3.3 \times 10^{14}$ | $1.8 \times 10^{11}$ | $3.0 \times 10^{11}$ | $1.0 \times 10^{11}$ |
| Moisture absorption | E-24/50 + D-24/23 | % | 0.4 | 0.5 | 0.4 | 0.8 | 1.0 | 1.2 |
| Punching charact. | C-96/23/55 |  | Excellent | Excellent | Excellent | Excellent | Good (slightly whitening) | Excellent |

The above has been offered for illustrative purposes only, and it is not for the purpose of limiting the scope of this invention, which is as defined in the claims below.

We claim:

1. An electrical laminate comprising a plurality of fibrous substrate layers and layers of a cured resin selected from the group consisting of an epoxy resin and an unsaturated polyester resin alternately disposed between and substantially extending over the surface of said substrate layers to form a unitary laminate, each of said substrate layers being embedded in a matrix of a cured resin which is substantially integral with the adjacent layers of cured resin, said substrate layers consisting generally of cellulosic fibers, the surface of the cellulosic fibers having thereon a coating comprising a methylol group-containing resin and characterized in that the amount of coating is in the range of 5 to 30% by weight of the dry substrate in terms of pick-up on a dry basis.

2. The electrical laminate of claim 1 further comprising an additional layer of said cured resin on the outer surface of at least one outermost substrate layer.

3. The electrical laminate of claim 2 wherein the laminate is clad with a metal foil on said additional layer of cured resin.

4. The electrical laminate of claim 1 or 3 wherein said cured layers and said matrix are made of the same resin.

5. The electrical laminate of claim 1 or 3 wherein said methylol group-containing resin is an aminoplast resin.

6. The electrical laminate of claim 5 wherein said aminoplast resin is selected from the group consisting of a urea resin, a cyclic urea resin, a melamine resin and a guanamine resin.

7. The electrical laminate of claim 6 wherein said aminoplast resin is modified with an additive for facilitating the punching operation of laminate selected from the group consisting of a higher fatty derivative having at least one functional group capable of condensing with a methylol group in the molecule, a compound having an unsaturated bond capable of copolymerizing with a vinyl monomer and also a functional group capable of condensing with a methylol group, a flexible epoxy resin, a fatty acid ester of epoxy resin, a flexible thermoplastic resin, an aromatic sulfonamide, an aromatic carboxamide, and an aromatic amine.

8. The electrical laminate of claim 1 or 3 wherein said cured resin is a liquid at room temperature and free from a solvent prior to curing.

9. The electrical laminate of claim 1 or 3 wherein said matrix of cured resin has a glass transition temperature from 20° to 80° C, preferably from 40° to 70° C.

10. The electrical laminate of claim 3 wherein said cladding metal foil is bonded with an epoxy adhesive.

11. The electrical laminate of claim 1 or 3 wherein each of the layers of cured resin is 1 to 100 μm thick.

12. The electrical laminate of claim 10 wherein each of the layers of cured resin is 1 to 30 μm thick.

13. The electrical laminate of claim 11 wherein each of the layers of cured resin is 5 to 25 μm thick.

* * * * *